(12) United States Patent
Chenebaux

(10) Patent No.: US 9,781,364 B2
(45) Date of Patent: Oct. 3, 2017

(54) ACTIVE PIXEL IMAGE SENSOR OPERATING IN GLOBAL SHUTTER MODE, SUBTRACTION OF THE RESET NOISE AND NON-DESTRUCTIVE READ

(71) Applicant: PYXALIS, Moirans (FR)

(72) Inventor: Grégoire Chenebaux, Moirans (FR)

(73) Assignee: PYXALIS, Moirans (FR)

( * ) Notice: Subject to any disclaimer, the term of this patent is extended or adjusted under 35 U.S.C. 154(b) by 0 days.

(21) Appl. No.: 15/216,496

(22) Filed: Jul. 21, 2016

(65) Prior Publication Data

US 2017/0026595 A1 Jan. 26, 2017

(30) Foreign Application Priority Data

Jul. 24, 2015 (FR) ...................................... 15 57073

(51) Int. Cl.
*H04N 5/363* (2011.01)
*H04N 5/355* (2011.01)
(Continued)

(52) U.S. Cl.
CPC ....... *H04N 5/363* (2013.01); *H01L 27/14609* (2013.01); *H01L 27/14623* (2013.01);
(Continued)

(58) Field of Classification Search
CPC .......... H04N 5/32; H04N 5/363; H04N 5/374; H04N 5/3741; H04N 5/37452;
(Continued)

(56) References Cited

U.S. PATENT DOCUMENTS 5,818,898 A 10/1998 Tsukamoto et al.
9,502,457 B2 * 11/2016 Korobov ............. H01L 27/1464
(Continued)

FOREIGN PATENT DOCUMENTS

FR 2 939 950 A1 6/2010
WO 2010/066850 A1 6/2010

OTHER PUBLICATIONS

B. Fowler et al., "A 5.5Mpixel 100 Frames/sec Wide Dynamic Range Low Noise CMOS Image Sensor for Scientific Applications," SPIE Proceedings vol. 7536, Sensors, Cameras, and Systems for Industrial/Scientific Applications XI, 2010.
(Continued)

*Primary Examiner* — Pritham Prabhakher
(74) *Attorney, Agent, or Firm* — Baker & Hostetler LLP

(57) ABSTRACT

An active pixel image sensor comprising a matrix of pixels organized in rows and columns and a read circuit comprising a distinct read pathway for each column of pixels, comprises: a photodiode, a storage node, a transfer transistor, a storage node reset transistor, a row select transistor and a transistor mounted as voltage follower; each read pathway comprises a subtraction block connected to receive, first, voltage at the terminals of the storage node of a pixel of the corresponding column and, second, a reference voltage of value substantially equal to the reset voltage of the pixels of the matrix seen at the input of the read pathway; the sensor comprises a controller for driving the transistors of pixels and the read circuit to perform an image acquisition in global shutter mode with subtraction of the reset noise and non-destructive reading of the pixels. A method for acquiring images is provided.

12 Claims, 5 Drawing Sheets

(51) Int. Cl.
*H04N 5/374* (2011.01)
*H04N 5/378* (2011.01)
*H01L 27/146* (2006.01)

(52) U.S. Cl.
CPC ... *H01L 27/14643* (2013.01); *H04N 5/35572* (2013.01); *H04N 5/374* (2013.01); *H04N 5/378* (2013.01)

(58) Field of Classification Search
CPC .... H04N 5/378; H04N 5/35572; H04N 5/235; H04N 5/3591; H04N 5/361; H04N 5/2355; H01L 27/14609; H01L 27/14623; H01L 27/14643; H01L 27/14654
USPC .................................. 348/294, 296, 241, 243
See application file for complete search history.

(56) References Cited

U.S. PATENT DOCUMENTS

| | | | |
|---|---|---|---|
| 9,602,750 B2* | 3/2017 | Hynecek | H04N 5/37457 |
| 2003/0076431 A1 | 4/2003 | Krymski | |
| 2007/0045681 A1 | 3/2007 | Mauritzson et al. | |
| 2012/0326008 A1* | 12/2012 | McKee | H04N 5/37452 250/208.1 |
| 2013/0001404 A1* | 1/2013 | Meynants | H01L 27/14609 250/208.1 |
| 2013/0038760 A1* | 2/2013 | Blanquart | H04N 5/365 348/241 |
| 2013/0314574 A1* | 11/2013 | Ishii | H01L 27/1461 348/302 |
| 2014/0085523 A1* | 3/2014 | Hynecek | H01L 27/14605 348/311 |
| 2015/0041865 A1* | 2/2015 | Storm | H04N 5/355 257/229 |
| 2015/0304578 A1* | 10/2015 | Okura | H04N 5/374 348/308 |
| 2016/0366402 A1* | 12/2016 | Myers | H04N 17/004 |

OTHER PUBLICATIONS

A. El Gamal et al., "CMOS Image Sensors," IEEE Circuits & Devices Magazine, May-Jun. 2005, pp. 6-20.

* cited by examiner

ACTIVE PIXEL IMAGE SENSOR OPERATING IN GLOBAL SHUTTER MODE, SUBTRACTION OF THE RESET NOISE AND NON-DESTRUCTIVE READ

CROSS-REFERENCE TO RELATED APPLICATION

This application claims priority to foreign French patent application No. FR 1557073, filed on Jul. 24, 2015, the disclosures of which are incorporated by reference in their entirety.

TECHNICAL FIELD

The invention relates to an image sensor of the active pixel type and to a method for acquiring images using such a sensor. The invention notably aims to make it possible to acquire images in global shutter mode with subtraction of the reset noise and non-destructive reading of the pixels.

BACKGROUND

Active pixel image sensors, generally produced in CMOS (complementary metal oxide semiconductor) technology are routinely used in electronic imaging systems. In these sensors, each pixel comprises a photodiode, optionally a storage node for the charges photogenerated by the photodiode ("floating diffusion") in the case of the use of a pinned photodiode, and a plurality of transistors (typically between 3 and 5 per pixel). A general introduction to these sensors is provided, for example, by the article by Abbas El Gamal and Helmu Rlyoukhy "*CMOS Image Sensors*", IEEE Circuits & Devices Magazine, May-June 2005, pages 6 to 20.

It is known that active pixel image sensors can operate without the need to use a mechanical shutter. The shutter function is then obtained in a purely electronic manner, by an appropriate driving of the transistors of each pixel. The electronic shutter produced in this way can be of "rolling" or "global" type.

In the case of a rolling shutter, the integration periods of the different rows of pixels are phase-shifted relative to one another. The document WO2010066850 discloses an image sensor operating notably with a rolling shutter. In order to extend the dynamic range of the sensor, the reading of the charges of a pixel is conditioned therein by the proximity or not of the saturation of the storage node. The document FR2939950 discloses another sensor with a rolling shutter, in which an extension of the dynamic range is obtained by avoiding the saturation of the storage nodes in the case of a very bright image, while guaranteeing enough sensitivity for a dark image.

In the case of a global shutter, however, all the pixels integrate the incident light simultaneously, the reading of the pixels being done subsequently and row by row. Operation in rolling shutter mode is simpler to produce and makes it possible to maximize the integration time for a given image acquisition rate, and therefore the sensitivity of the sensor, but produces damaging artefacts (distortion of the scene, etc.) if the scene changes rapidly (moving object, sudden change in lighting conditions, etc.). Thus, some applications require a global shutter.

It is also known that active pixel image sensors are affected by different types of noise.

The document U.S.2007/045681 proposes a solution for reducing the noise linked to the dark current by performing charge transfers from the photodiode in a pulsed manner in order to limit this noise contribution. This noise is associated with the leakage current of the junction of the photodiode and originates from the phenomena of electron generation/recombination.

Among these different types of noise, the noise called "kTC", or reset noise, can also be cited. Before acquiring an image, an active pixel is reset to an assumed known voltage (potential difference relative to ground); then it begins to accumulate photogenerated charges, which leads to a reduction of its voltage. If the reset voltage was perfectly known, the measurement of the voltage at the output of the pixel at the end of the integration would make it possible to determine the incident light intensity. In fact, the reset voltage varies unpredictably from one image to another because of the thermal fluctuations of the charge carriers. To eliminate this source of noise, it is necessary to sample the output voltage of the pixel twice—just after the reset and at the end of the integration period for a three-transistor (3T) pixel, or just after the reset and just after a charge transfer for a four-transistor (4T) or more pixel—and to subtract the first sample from the second. This technique is known as correlated double sampling (CDS). In its simplest form, correlated double sampling is not compatible with the use of a global shutter for matrix sensors that have a significant number of rows (of the order of ten or more). In this case, it is known practice to use a technique called "correlated quadruple sampling" (CQS), which consists in acquiring two images for each image, one in the absence of light ("black image" representative of the reset voltages of all the pixels) and the other after having illuminated the pixel for the desired integration time ("integration image" obtained after a global transfer of the charges in the matrix). The acquisition of the black and integration images is made possible by the fact that, in the pixels that are compatible with this technique, a transistor, called transfer transistor, makes it possible to isolate the source of the photogenerated charges (pinned photodiode) from a non-illuminated storage node. Both the black image and the integration image are obtained by difference between two voltage samples. The black image is the resultant of the difference between a reference voltage and a voltage acquired after the end of the reset of the storage node. The integration image is the resultant of the difference of a voltage acquired at the end of the integration time, after a transfer operation performed globally between the black image and the integration image, and of the same reference voltage. More specifically, first of all, row by row, the storage nodes are reset with the concomitant acquisition of the reset voltage which is a constant voltage level with little noise which serves as reference voltage; after a predefined time, the reset of the storage node is stopped and the voltage of the pixels representative of the noise sampled on the storage node is acquired again, the difference between the two acquisitions forming the black image. During this time, the photodiodes of all the pixels integrate electrical charges which, after the acquisition of the black image, are transferred globally to the corresponding storage nodes. To obtain the integration image, there is a first acquisition of the voltage at the terminals of the storage nodes followed, during the reset of said nodes, by a second voltage acquisition, to re-obtain the reference level, with little noise, and finally the subtraction of the two duly acquired voltages.

The black image obtained in this way essentially constitutes a measurement of the post-reset noise (random difference between the reset voltage and the voltage at the terminals of the storage node after reset), which noise itself affects the integration image, because the storage node is not reset between the two acquisitions. Consequently, this noise can be eliminated by subtraction of the two images. The article by B. Fowler et al. "*A 5.5 Mpixel 100 Frames/sec Wide Dynamic Range Low Noise CMOS Image Sensor for Scientific Applications,*" SPIE Proceedings 7536—Sensors, Cameras, and Systems for Industrial/Scientific Applications XI, describes an active pixel image sensor implementing the CQS technique combined with a global electronic shutter. One drawback of such a sensor is that the reading of the voltages of the pixels is necessarily destructive, because it is accompanied by a reset of the storage nodes in order to acquire the reference voltage. Now, a non-destructive read would be preferable in some applications, because it would make it possible to perform a plurality of readings of the pixels while continuing to integrate the photogenerated charges in order to stop the integration when the exposure level is optimal. Any risk of under or over-exposure would thus be avoided.

SUMMARY OF THE INVENTION

The invention aims to provide an active pixel image sensor that makes it possible to combine operation in global shutter mode with subtraction of the reset noise (or kTC) and non-destructive reading of the pixels. Secondarily, the invention also aims to minimize the global noise level and the complexity of the pixel read electronics.

One idea on which the invention is based, making it possible to achieve this aim, consists in using an external voltage reference, generated for example in the read circuit of the matrix of pixels, instead of using the reset voltage of the storage nodes as reference level. That makes it possible to perform this reset only once, during the phase of reading of the black image which is thus non-destructive. Moreover, the reference voltage generated in the read circuit can be much less noisy than the reset voltage of the storage nodes; in effect, a high-performance voltage level generation circuit can be provided outside the matrix, but cannot reasonably be integrated in the pixels. Furthermore, this reference voltage is available permanently, which simplifies the design of the read circuit compared to the case described in the above-mentioned article by B. Fowler et al.

One subject of the invention is therefore an active pixel image sensor comprising a matrix of pixels organized in rows and columns and a read circuit comprising a distinct read pathway for each column of pixels, in which each pixel comprises:
 a photodiode,
 a storage node for the electrical charges integrated by said photodiode,
 a transfer transistor for selectively allowing the transfer of said electrical charges from the photodiode to the storage node,
 a storage node reset transistor for selectively linking said storage node to a source of reset voltage,
 a row select transistor for selectively connecting said pixel to the read pathway of the column to which it belongs, and
 a transistor mounted as voltage follower for transferring to said read pathway the voltage at the terminals of the storage node via said row select transistor;
wherein each read pathway comprises a subtraction block having two inputs and one output, said subtraction block being connected to receive, on a first input, the voltage at the terminals of the storage node of one of the pixels of the corresponding column via the transistor mounted as voltage follower and via the row select transistor of said pixel and, on a second input, a reference voltage of value substantially equal to the reset voltage of the pixels of the matrix seen at the input of the read pathway, and to supply, at its output, a signal representative of a difference in the voltage levels present at its inputs;

and in that said sensor also comprises a controller configured for driving the transistors of the pixels and the read circuit to:
 perform a global reset of the photodiodes;
 perform a reset of the storage nodes of the pixels of the matrix and acquire a first digital image, called black image; then
 perform a global charge transfer from the photodiodes to the storage nodes of said pixels; then
 acquire a second digital image, called integration image;
 so as to perform an image acquisition in global shutter mode with subtraction of the reset noise and reading of the pixels that does not destroy the integrated charges.

According to different embodiments of such a sensor:
 The sensor can also comprise at least one generator of said reference voltage, external to said matrix of pixels.
 Each said subtractor block can be a differential digitization chain configured for supplying, at its output, a digital signal representative of the difference in the analogue voltage levels present at its inputs.
 Said controller can be configured for driving the transistors of the pixels and the read circuit to reset the storage nodes of the pixels row by row.
 A first and a second sample and hold circuit can be present at the first and second inputs of each said subtraction block, respectively, and said controller can be configured for:
  a) activating the reset transistor or transistors of all the pixels to reset their photodiodes and their storage nodes;
  b) activating the first sample and hold circuits of each read pathway, such that a sample of the reference voltage is present on the first input of each subtraction block;
  c) for each column of pixels, and after resetting of the corresponding storage nodes:
   c1) successively activating the row select transistors,
   c2) in coordination with each activation of a row select transistor, activating the second sample and hold circuit of the read pathway corresponding to said column such that a voltage sample is present on the second input of the corresponding subtraction block; then
   c3) driving the analogue-digital converter of said read pathway,
  whereby a first digital image, called black image, is acquired row by row; and then:
  d) activating the transfer transistors of all the pixels, so as to produce a global charge transfer from the photodiodes to the storage nodes of said pixels;
  e) activating the first sample and hold circuits of each read pathway, such that a sample of the reference voltage is present on the first input of each subtractor block;
  f) for each column of pixels, and after charge transfer to the corresponding storage nodes:
   f1) successively activating the row select transistors,
   f2) in coordination with each activation of a row select transistor, activating the second sampler-blocker of the read pathway corresponding to said column, then f3) driving the analogue-digital converter of said read pathway, whereby a second digital image, called integration image (IIM), is acquired row by row;

no resetting of the photodiodes or of the storage nodes being performed between the operations b) and f3).

Said controller can also be configured for repeating the operations d) to f3) one or more times, according to a signal level of said integration image or images, before once again performing the operations a) to c), such that one or more integration images are acquired for one and the same black image.

The sensor can also comprise a digital image processor configured for subtracting, from said or from one said integration image, the corresponding black image.

Said pixels can comprise a photodiode reset transistor and a storage node reset transistor that are distinct.

Each pixel can also comprise a photodiode reset transistor for selectively linking the photodiode to a source of reset voltage.

Another subject of the invention is a method for acquiring images by means of an active pixel image sensor comprising a matrix of pixels organized in rows and columns and a read circuit comprising a distinct read pathway for each column of pixels, in which each pixel comprises:
- a photodiode,
- a storage node for the electrical charges generated by said photodiode when it is illuminated,
- a transfer transistor for selectively allowing the transfer of said electrical charges from the photodiode to the storage node,
- at least one reset transistor for selectively linking the photodiode and the storage node to a source of reset voltage,
- a row select transistor for selectively connecting said pixel to the read pathway of the column to which it belongs, and
- a transistor mounted as voltage follower for transferring to said read pathway the voltage at the terminals of the storage node via said row select transistor;

the method comprising the following steps:
- A) activating the reset transistor or transistors of all the pixels to reset their photodiodes and their storage nodes;
- B) sampling a reference voltage, generated in said read circuit and of value substantially equal to the reset voltage of the pixels of the matrix;
- C) for each column of pixels, and after resetting of the corresponding storage nodes: successively activating the row select transistors, sampling the voltage at the terminals of the storage node of the corresponding pixel, subtracting the reference voltage sampled in the step B) from the duly sampled voltage and digitizing the result, so as to acquire, row by row, a first digital image called black image; and then:
- D) activating the transfer transistors of all the pixels, so as to produce a global charge transfer from the photodiodes to the storage nodes of said pixels;
- E) sampling a reference voltage, generated in said read circuit and of value substantially equal to the reset voltage of the pixels of the matrix;
- F) for each column of pixels, and after charge transfer to the corresponding storage nodes: successively activating the row select transistors, sampling the voltage at the terminals of the storage node of the corresponding pixel, subtracting the reference voltage sampled in the step E) from the duly sampled voltage and digitizing the result, so as to acquire, row by row, a second digital image, called integration image.

According to different embodiments of such a method:
The steps D) to F) can be repeated one or more times, according to a signal level of said integration image or images, before once again performing said steps A) to C), such that one or more integration images are acquired for one and the same black image.
The method can also comprise a step consisting in subtracting, from said or from one said integration image, the corresponding black image.

BRIEF DESCRIPTION OF THE DRAWINGS

Other features, details and advantages of the invention will become apparent on reading the description given with reference to the attached drawings which are given by way of example and which represent, respectively.

DETAILED DESCRIPTION

Figure 1:
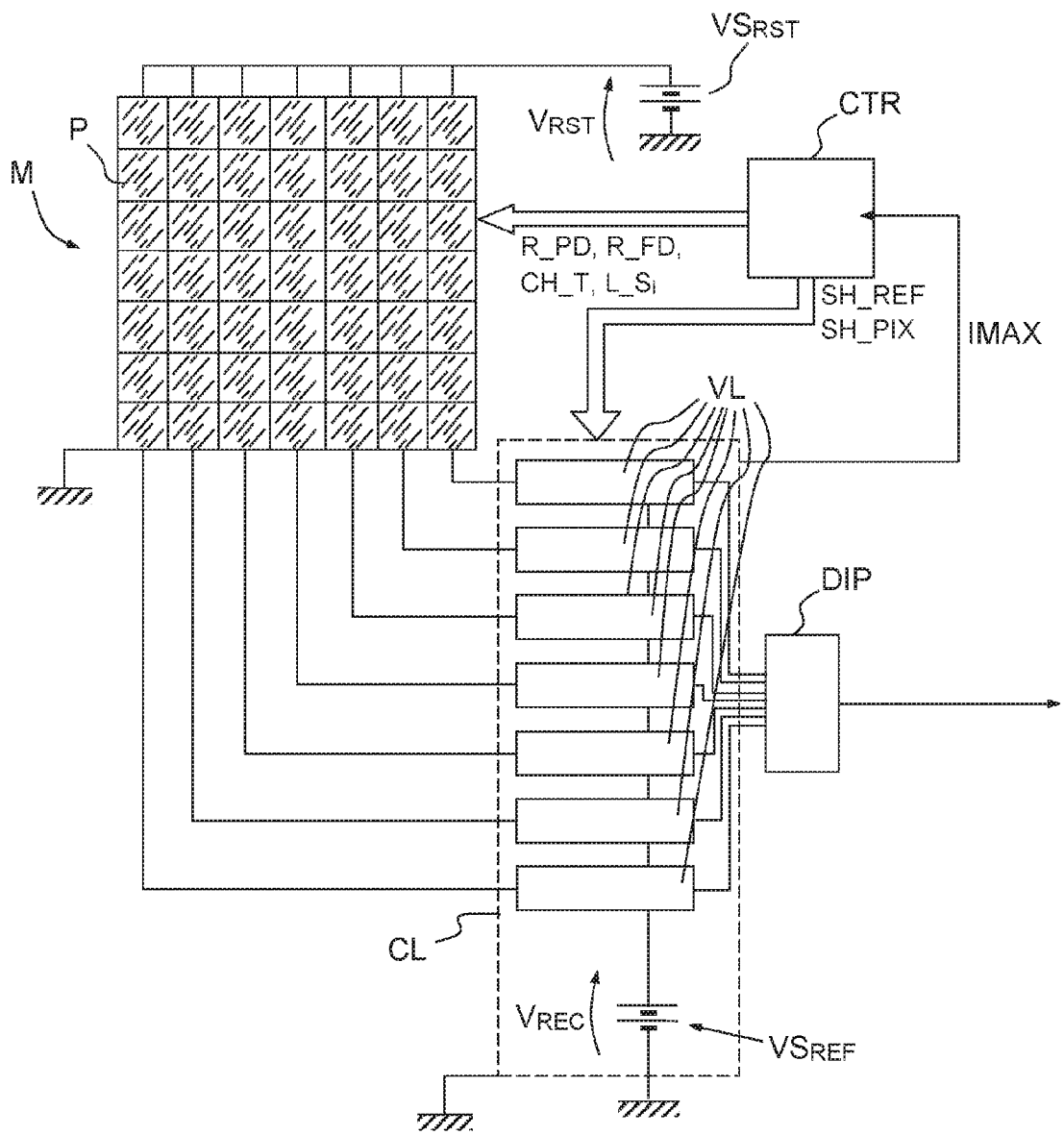
FIG. 1, a functional overview diagram of an image sensor according to an embodiment of the invention.

While the present invention is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

As illustrated in FIG. 1, an image sensor according to an embodiment of the invention comprises a matrix M of active pixels P which are arranged in rows and in columns. The matrix M used for the acquisition of images can be a subset of a larger matrix, of which certain rows and/or columns may not be used in a given application.

Figure 2:
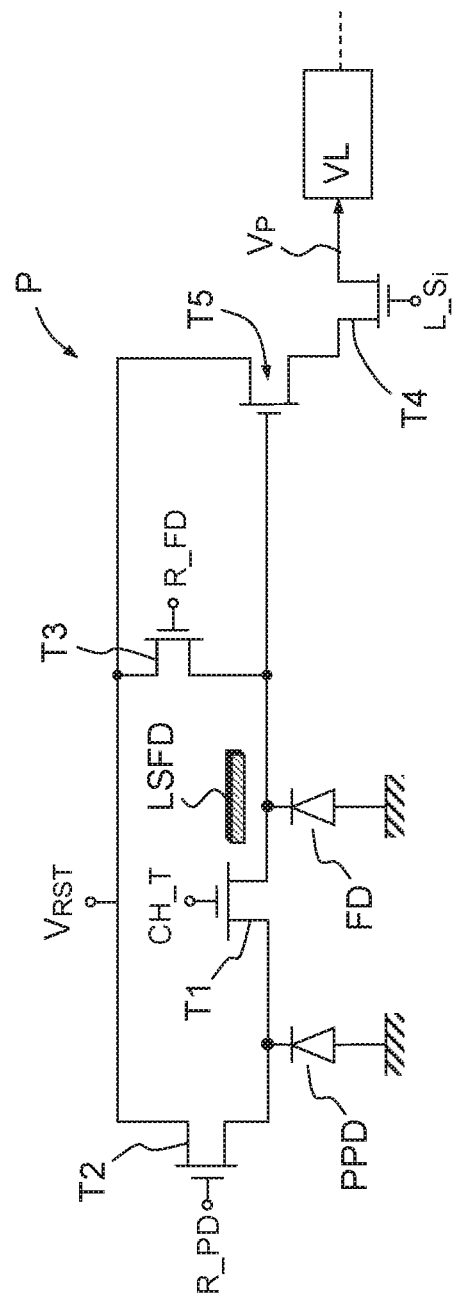
FIG. 2, the electrical circuit diagram of an active pixel with five transistors that can be used in the image sensor of FIG. 1.

An embodiment of the pixels of the matrix M is illustrated in FIG. 2.

Figure 3:
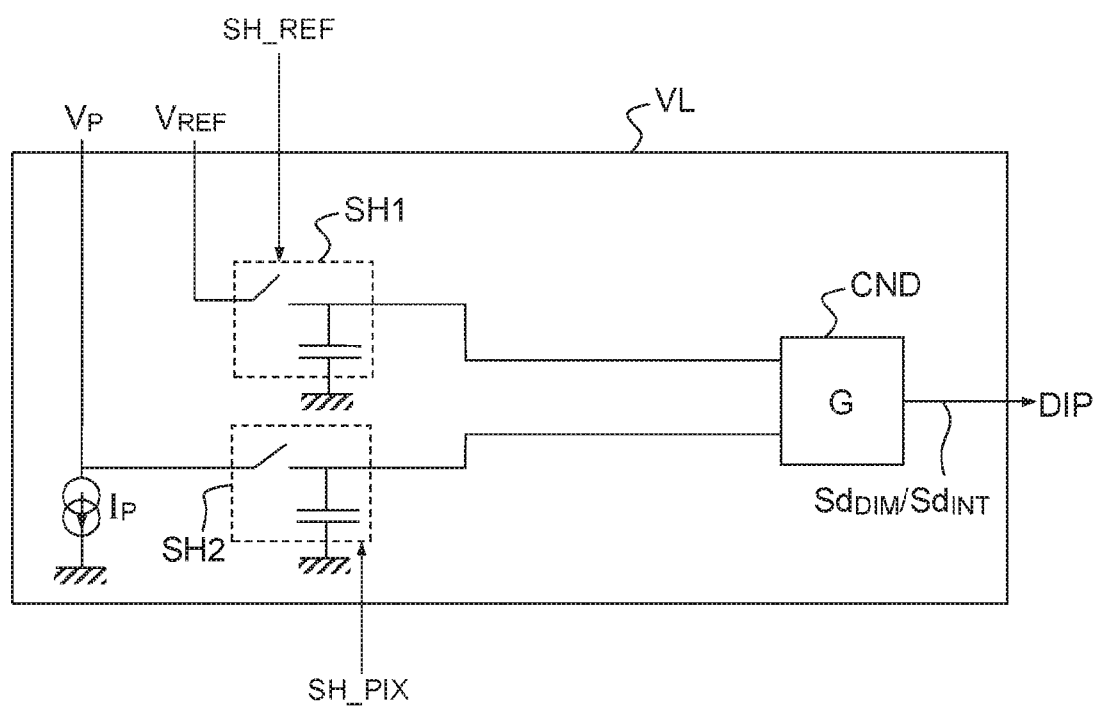
FIG. 3, the simplified electrical circuit diagram of a read pathway of the image sensor of FIG. 1.

Conventionally, all the pixels of one and the same column are linked, via select transistors (not represented in FIG. 1; reference T4 in FIG. 2) to a respective read pathway VL, a simplified circuit diagram of which is provided by FIG. 3. Upon the acquisition of an image, the select transistors of all the pixels of one and the same row are activated at the same time; thus, an image is acquired row by row. The matrix M is connected to a source $VS_{RST}$ of direct voltage $V_{RST}$. This voltage is called "reset voltage" because, as will be explained with reference to FIG. 2, the storage nodes are reset by connecting them to the source $VS_{RST}$ to bring them to the potential $V_{RST}$.

The read pathways VL are connected to a source $VS_{REF}$ of direct voltage $V_{REF}$. This voltage $V_{REF}$, called reference voltage, is substantially identical to the image $V_{RST\ COL}$ of the reset voltage $V_{RST}$ on the column connector CCi linking the pixels of the matrix to the read pathways VL. "Substantially identical" should be understood to mean that the voltage $V_{REF}$ is included in the possible distribution of the images on the column connector of the reset voltages of all the pixels of the matrix.

In the embodiment of FIG. 1, the read pathways and the reference voltage source are combined in a read circuit CL. This circuit receives as input the analogue signals from the matrix M and supplies, at its output, "raw" digital images, which are processed by a digital image processor DIP. The latter, notably, subtracts the black images from the corresponding integration images in order to eliminate the reset noise.

Figure 4:
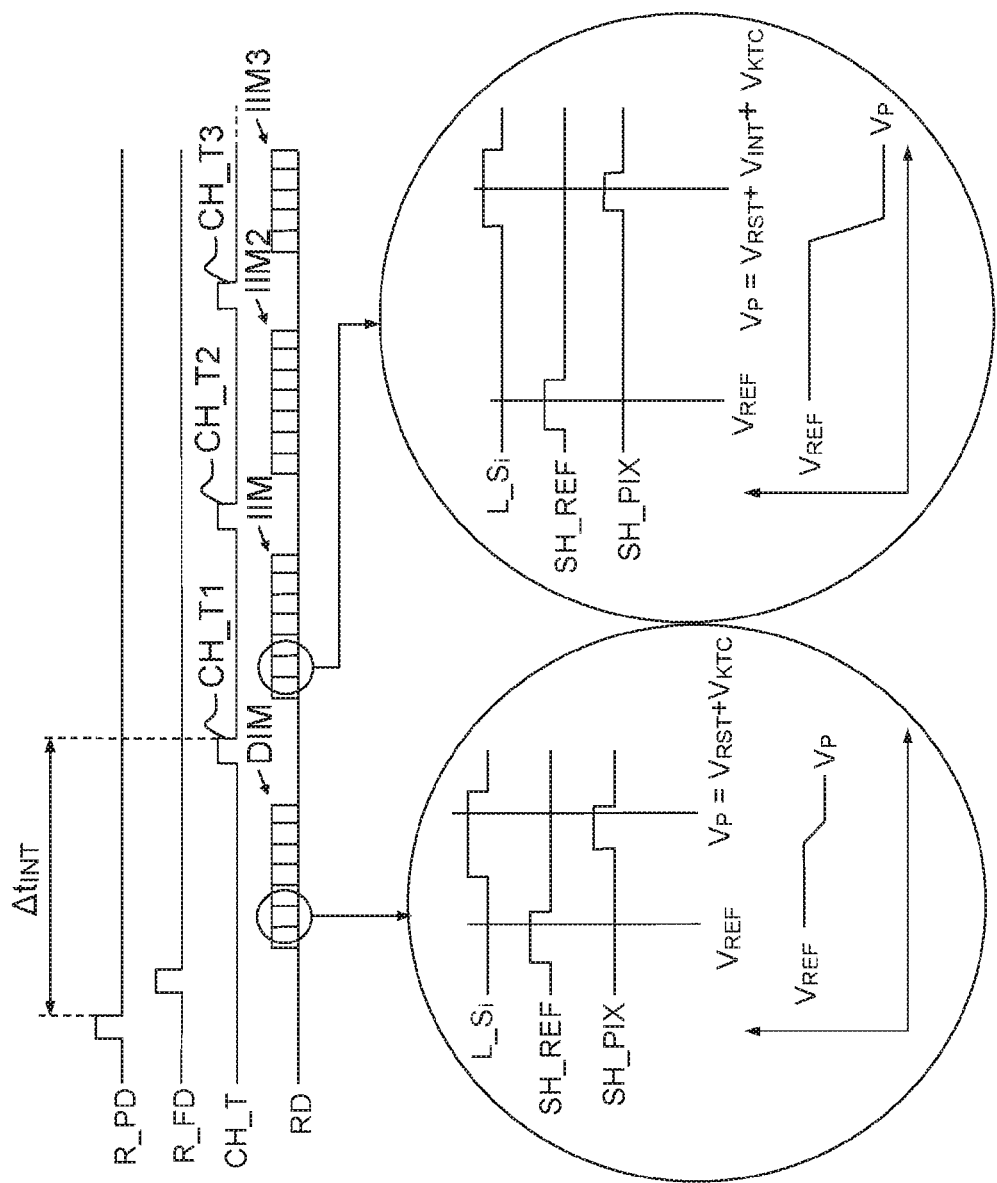
FIG. 4, a timing diagram illustrating a first mode of operation of the image sensor of FIG. 1.

The sensor of FIG. 1 also comprises a controller CTR which generates signals driving the transistors of the pixels of the matrix (R_PD, R_FD, CH_T, L_Si) and the read pathways (SH_REF, SH_PIX). Timing diagrams of these signals are represented in FIG. 4 and will be discussed in detail later. Optionally, the controller CTR can also receive a signal IMAX from the read circuit or from the image processor which is representative of a signal level of the integration images acquired. For example, IMAX may correspond to the highest signal level out of the pixels of the matrix. The use of this signal will be detailed later, with reference to FIG. 4.

The digital image processor DIP and the controller CTR may consist of (or comprise) one or more microprocessors programmed appropriately and/or dedicated digital circuits.

FIG. 2 illustrates the architecture of a pixel P of the matrix M. This is a conventional architecture, called "5T", that is to say with 5 transistors. This pixel comprises a pinned photodiode PPD, which integrates electrical charges when the pixel is illuminated. A transistor T1 is connected between the photodiode and a so-called "floating diffusion" pn junction, identified by the reference FD, which is protected from the light by a screen LSFD. When the transistor T1 is inactive, the photodiode PPD accumulates the charges of photonic origin; when the transistor—driven by the signal CH_T generated by the controller CTR—is active, the charges stored in the photodiode PPD are transferred to the junction FD, which then serves as charge storage node. Two transistors T2, T3, driven by the signals R_PD and R_FD, respectively, make it possible to reset the photodiode and the charge storage node through the voltage source $VS_{RST}$. The voltage at the terminals of the charge storage node is read by a transistor T5 connected as voltage follower (the drain of this transistor being at the voltage $V_{RST}$), and transmitted to the read pathway of the column "i" to which the pixel belongs via a row select transistor T4, driven by the signal L_Si (where "i" identifies the column).

FIG. 3 illustrates the simplified electrical circuit diagram of a read pathway VL according to an embodiment of the invention. This read pathway comprises a current source $I_p$ distributing a bias current to all the pixels of one same column, according to the selection of the row L_Si. This read pathway also comprises a first sample and hold circuit SH1 driven by the signal SH_REF generated by the controller CTR and the input of which is linked to the source of reference voltage $VS_{REF}$, and a second sample and hold circuit SH2 driven by the signal SH_PIX generated by the controller CTR and the input of which is linked to the pixels of one and the same column of the matrix M via the row select transistors of these pixels; $V_P$ is used to indicate the voltage applied to the input of SH2 when one of these select transistors is activated. The outputs of these sample and hold circuits are connected to the inputs of a differential digitization chain CND, which can typically produce a single-ramp analogue-digital conversion. The digital signal generated by this converter, proportional to the digitized difference between the sampled values of $V_P$ and $V_{REF}$, is supplied as input to the digital image processor DIP.

FIG. 4 illustrates a mode of operation of the sensor of FIG. 1, and more specifically an embodiment of its image acquisition sequence.

The sequence begins with a global reset (that is to say a reset concerning all the pixels) of the photodiodes (signal R_PD). The global reset of the charge storage nodes (signal R_FD) takes place a little before the reading of the image DIM. The falling edge of the signal R_PD, that is to say the end of the global photodiode reset operation, triggers the start of the light integration time, which has a duration $\Delta t$ and ends on the falling edge of the signal CH_T which triggers the stopping of the global charge transfer from the photodiodes to the charge storage nodes.

In parallel with the integration time $\Delta t$, there is the acquisition of the black image DIM, which is performed row by row. The insert in the bottom left part of the figure illustrates the operations which lead to the acquisition of a pixel of the black image; these operations are performed simultaneously for all the columns (and therefore all the read pathways) and successively for all the rows. First of all, the signal SH REF activates the sample and hold circuit SH1 for it to acquire a sample of the reference voltage $V_{REF}$. Next, the signal L_Si activates the row select transistor of a pixel of the i-th row of the matrix M; during the time of activation of this transistor, the signal SH_PIX activates the sample and hold circuit SH2 for it to acquire a sample of the voltage $V_P$ at the terminals of the charge storage node of this pixel. The three operations L_Si, SH_P IX and SH_REF could also be done simultaneously for all the rows. Since there has not been a charge transfer since the storage node reset operation (R_FD), the voltage $V_P$ is equal to $V_{RST\_COL}$, the image of the reset voltage $V_{RST}$ on the conductor $V_P$, to which is added—algebraically—a thermal noise $V_{KTC}$: $V_P = V_{RST\_COL} + V_{KTC}$. The output signal of the differential digitization chain CND is a digital image of the difference in the two sampled values: $sd_{DIM} = G(V_{RST\_COL} + V_{KTC} - V_{REF})$, where G represents a gain of the read chain VL. Given that $V_{REF} \cong V_{RST\_COL}$ and has almost no noise, it is possible to write $sd_{DIM} \cong G \cdot V_{KTC}$, where the index "DIM" recalls that it is a signal relative to the black image. It can therefore be seen that the black image essentially constitutes a mapping of the reset noise of the matrix M.

The acquisition of the integration image IIM (illustrated by the insert in the bottom right part of the figure) comprises the same operations, but which are implemented after the global charge transfer. Thus, in this case $V_P = V_{RST\_COL} + V_{KTC} + V_{INT}$, where $V_{INT}$ (generally less than 0) is the useful signal on the conductor $V_P$, proportional to the light energy intercepted by the photodiode of the pixel during the integration time $\Delta t$. Recalling that $V_{REF} \cong V_{RST\_COL}$, it is therefore possible to write $sd_{INT} \cong G \cdot (V_{INT} + V_{KTC})$. Consequently, the reset noise $V_{KTC}$ can be eliminated by calculating the difference between $sd_{INT}$ and $sd_{DIM}$: $sd_{INT} - sd_{DIM} \cong G \cdot V_{INT}$. Advantageously, this subtraction is calculated digitally by the DIP processor.

Figure 5:
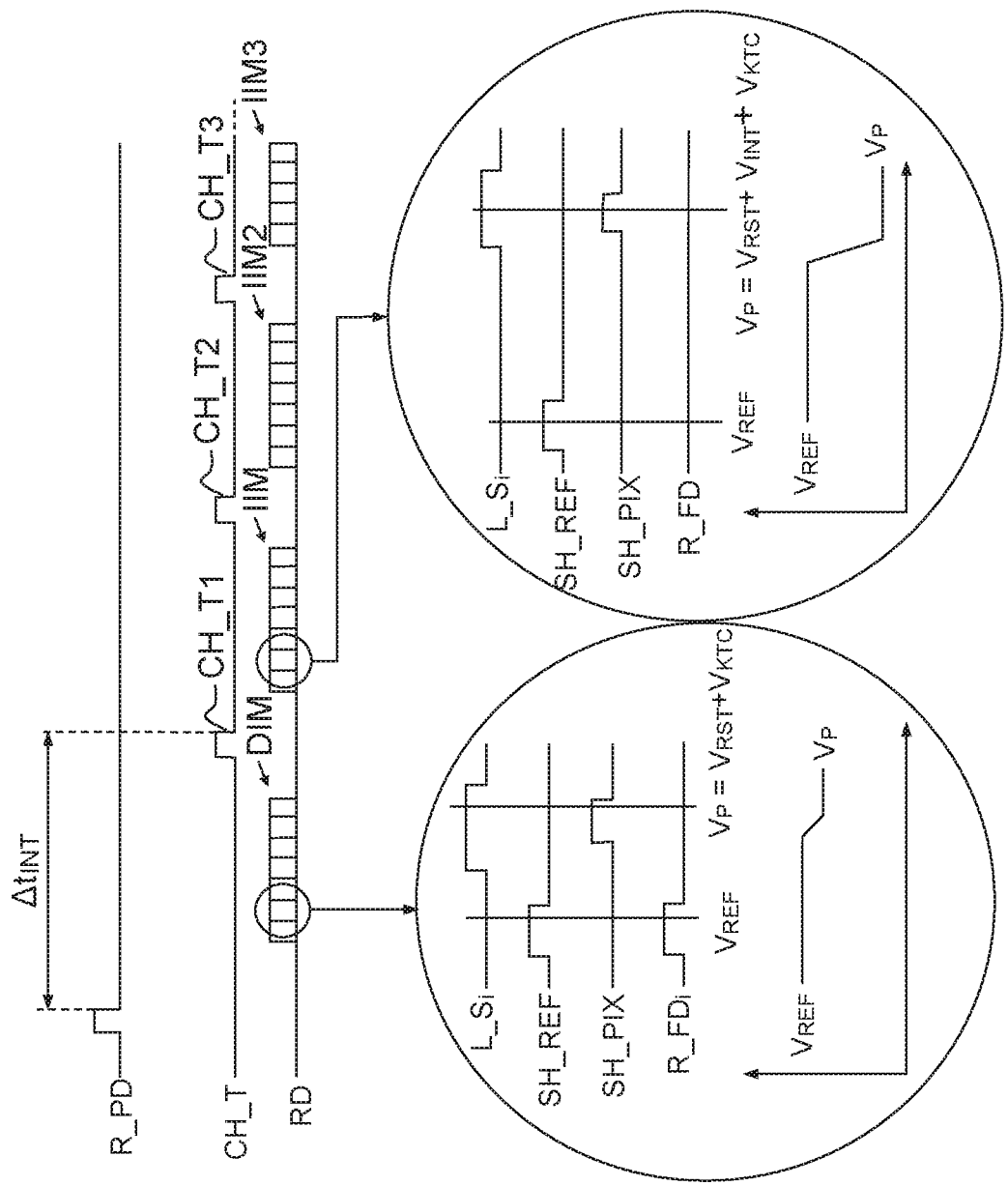
FIG. 5, a timing diagram illustrating a second mode of operation of the image sensor of FIG. 1.

FIG. 5 illustrates an alternative mode of operation of the sensor of FIG. 1, and more specifically another embodiment of its image acquisition sequence, in which the storage nodes are not reset simultaneously, but row by row during the acquisition (performed also row by row) of the black image. In this case, the single reset signal of the storage nodes R_FD is replaced by a plurality of reset signals R_FDi, one for each row. For each row "i", this reset signal R_FDi must precede the sampling of the signal $V_P$, and therefore the falling edge of the signal SH_PIX. By contrast, the reset of all the photodiodes remains global, as does their charge transfer, such that the integration phase is simultaneous for all the pixels of the matrix. The resetting of the storage nodes row by row reduces the fluctuations of the reset voltage, and therefore the static noise level of the image.

In the sensor described by the abovementioned article by B. Fowler et al., the reference voltage is acquired by reading each pixel during the reset of its charge storage node. Thus, the reference (or reset) voltage is not available permanently, and must be stored in an analogue memory in order to be subtracted from the useful signal. To implement this analogue subtraction, furthermore, it is necessary to provide a switching module making it possible to reverse the two inputs of the differential amplifier arranged at the input of its analogue-digital converter to change the sign of the output signal; the invention makes it possible to avoid this additional complexity. Furthermore, the choice of a reference outside of the matrix makes it possible to produce a reference with very low noise, an essential element of the preceding operation. Thus, the invention allows for an appreciable simplification of the architecture of the read circuit accompanied by enhanced performance in terms of noise.

However, the main advantage of the invention is that the reading of a pixel does not require the resetting of its storage node, or of its photodiode; it is said to be non-destructive. Thus, after the first global charge transfer (CH_T 1 in FIG. 4) and the reading of the pixels row by row, the photodiodes continue to integrate photogenerated charges. It is therefore possible to proceed with subsequent charge transfers—pulses CH_T2, CH_T3 etc.—followed by other non-destructive reads. There are thus obtained, for a single black image, a plurality of integration images IIM, IIM2, IIM3 corresponding to increasing integration times (for example $\Delta t_{INT}$, $2 \cdot \Delta t_{INT}$ and $3 \cdot \Delta t_{INT}$, respectively).

The integration times are not necessarily identical if the pulses R_PD had to appear between CH_T1 and CH_T2 or CH_T2 and CH_T3 for example. That makes it possible in particular to optimize the exposure of the final image. For example, after acquisition of the first integration image, the processor DIP can determine the signal IMAX intensity corresponding to the most illuminated pixel of this image. This value is transmitted to the controller CTR. If IMAX is sufficiently close to a predefined value, corresponding to the saturation of the pixel, the acquisition sequence is stopped; otherwise, another non-destructive read is carried out, and so on. The integration time is thus adapted to the lighting conditions, within the limit of the constraints imposed by the acquisition rate demands. Such a mode of operation would not be possible in the case of the sensor of the abovementioned article by B. Fowler et al., in which the reading of a pixel is necessarily destructive, always being accompanied by the reset thereof. To achieve the same aggregated signal level as the sensor of B. Fowler et al., it would be necessary to proceed with multiple acquisitions, each with its own noise-generating reset. In the case of the invention, however, only two images are subtracted in all the cases, which makes it possible to considerably reduce the noise level.

The invention has been described in relation to a particular embodiment, but numerous variants can be envisaged. In particular:

The sensor may not comprise the processor DIP, the functions of which can be implemented by an external device. The same applies for the controller CTR.

One and the same processor and/or dedicated digital circuit can be used to accomplish the functionalities of the processor DIP and of the controller CTR. Or, the processor DIP and the controller CTR can be physically distinct devices.

The read circuit, the processor DIP, the controller CTR, the voltage sources $VS_{RST}$ et $VS_{REF}$ can be co-integrated in the matrix M, or not. These elements can be produced in fully integrated form or use discrete components.

Several known circuit diagrams can be used to produce the direct voltage sources $VS_{RST}$ and $VS_{REF}$.

The active pixels can have architectures different from that ("5T") illustrated in FIG. 1. For example, it is possible to use "4T" pixels which do not comprise the transistor T2, such that the reset of the photodiode is done via T1 and T3. In any case, each pixel must comprise at least one photodiode, a storage node, a transfer transistor, at least one reset transistor, a row select transistor and at least one transistor mounted as amplifier, as a voltage follower for example.

The circuit diagram of FIG. 3 is highly simplified. Read circuits known from the prior art can be used to implement the invention.

In the circuit diagram of FIG. 3, the case where each read pathway comprises a differential digitization chain has been considered. As a variant, the read pathways can comprise analogue subtractor circuits and supply, at their output, analogue differential signals, digitized using an analogue-digital converter; the latter can be common to several read pathways, even to all thereof, and need not necessarily be integrated in the read circuit (it can, for example, form part of the image processor). It would even be possible to envisage a digitization of the sampled signals $V_P$ and $V_{REF}$, followed by a subtraction operation implemented digitally. In any case, each read pathway must comprise a subtraction block—produced in analogue or digital form or in the form of a differential analogue-digital converter.

The image acquisition sequence can differ from that described in relation to FIG. 4. For example:

the photodiodes can be reset before, after or at the same time as the storage nodes;

the reference voltage can be acquired before, after or at the same time as the voltage at the terminals of each storage node.

A sensor according to the invention is suitable for use in global shutter mode while allowing a non-destructive read of the pixels. Nevertheless, it can also be used in rolling shutter mode and the acquisition of multiple integration images is only optional.

In case of acquisition of multiple integration images for one and the same black image, the individual integration times separating two successive charge transfers need not be the same.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

The true scope and spirit of the invention is indicated by the following claims.

The invention claimed is:

1. An active pixel image sensor comprising a matrix of pixels organized in rows and columns and a read circuit comprising a distinct read pathway for each column of pixels, in which each pixel comprises:
   a photodiode,
   a storage node for the electrical charges integrated by said photodiode,
   a transfer transistor for selectively allowing the transfer of said electrical charges from the photodiode to the storage node,
   a storage node reset transistor for selectively linking said storage node to a source of reset voltage,
   a row select transistor for selectively connecting said pixel to the read pathway of the column to which it belongs, and
   a transistor mounted as voltage follower for transferring to said read pathway the voltage at the terminals of the storage node via said row select transistor;
   wherein each read pathway comprises a subtraction block having two inputs and one output, said subtraction block being connected to receive, on a first input, the voltage at the terminals of the storage node of one of the pixels of the corresponding column via the transistor mounted as voltage follower and via the row select transistor of said pixel and, on a second input, a reference voltage external to said matrix, of value substantially equal to the reset voltage of the pixels of the matrix seen at the input of the read pathway, and to supply, at its output, a signal representative of a difference in the voltage levels present at its inputs;
   and wherein said sensor also comprises a controller configured for driving the transistors of the pixels and the read circuit to:
   perform a global reset of the photodiodes;
   perform a reset of the storage nodes of the pixels of the matrix and acquire a first digital image, called black image; then
   perform a global charge transfer from the photodiodes to the storage nodes of said pixels; then
   acquire a second digital image, called integration image;
   so as to perform an image acquisition in global shutter mode with subtraction of the reset noise and reading of the pixels that does not destroy the integrated charges.

2. The active pixel image sensor of claim 1, also comprising at least one generator of said reference voltage, external to said matrix of pixels.

3. The active pixel image sensor of claim 1, wherein each said subtractor block is a differential digitization chain configured for supplying, at its output, a digital signal representative of the difference in the analogue voltage levels present at its inputs.

4. The active pixel image sensor of claim 1, wherein said controller is configured for driving the transistors of the pixels and the read circuit to reset the storage nodes of the pixels row by row.

5. The active pixel image sensor of claim 1, wherein a first and a second sample and hold circuit are present at the first and second inputs of each said subtraction block, respectively, and said controller is configured for:
   a) activating the reset transistor or transistors of all the pixels to reset their photodiodes and their storage nodes;
   b) activating the first sample and hold circuits of each read pathway, such that a sample of the reference voltage is present on the first input of each subtraction block;
   c) for each column of pixels, and after resetting of the corresponding storage nodes:
      c1) successively activating the row select transistors,
      c2) in coordination with each activation of a row select transistor, activating the second sample and hold circuit of the read pathway corresponding to said column such that a voltage sample is present on the second input of the corresponding subtraction block; then
      c3) driving the analogue-digital converter of said read pathway, whereby a first digital image, called black image, is acquired row by row; and then:
   d) activating the transfer transistors of all the pixels, so as to produce a global charge transfer from the photodiodes to the storage nodes of said pixels;
   e) activating the first sample and hold circuits of each read pathway, such that a sample of the reference voltage is present on the first input of each subtractor block;
   f) for each column of pixels, and after charge transfer to the corresponding storage nodes:
      f1) successively activating the row select transistors,
      f2) in coordination with each activation of a row select transistor, activating the second sample and hold circuit of the read pathway corresponding to said column, then
      f3) driving the analogue-digital converter of said read pathway, whereby a second digital image, called integration image, is acquired row by row;
   no resetting of the photodiodes or of the storage nodes being performed between the operations b) and f3).

6. The active pixel image sensor of claim 5, wherein said controller is also configured for repeating the operations d) to f3) one or more times, according to a signal level of said integration image or images, before once again performing the operations a) to c), such that one or more integration images are acquired for one and the same black image.

7. The active pixel image sensor of claim 5, also comprising a digital image processor configured for subtracting, from said or from one said integration image, the corresponding black image.

8. The active pixel image sensor of claim 1, wherein said pixels comprise a photodiode reset transistor and a storage node reset transistor that are distinct.

9. The active pixel image sensor of claim 1, wherein each pixel also comprises a photodiode reset transistor for selectively linking the photodiode to a source of reset voltage.

10. A method for acquiring images by means of an active pixel image sensor comprising a matrix of pixels organized in rows and columns and a read circuit comprising a distinct read pathway for each column of pixels, wherein each pixel comprises:
    a photodiode,
    a storage node for the electrical charges generated by said photodiode when it is illuminated,
    a transfer transistor for selectively allowing the transfer of said electrical charges from the photodiode to the storage node,
    at least one reset transistor for selectively linking the photodiode and the storage node to a source of reset voltage,
    a row select transistor for selectively connecting said pixel to the read pathway of the column to which it belongs, and
    a transistor mounted as voltage follower for transferring to said read pathway the voltage at the terminals of the storage node via said row select transistor;

the method comprising the following steps;

A) activating the reset transistor or transistors of all the pixels to reset their photodiodes and their storage nodes;

B) sampling a reference voltage external to said matrix, generated in said read circuit and of value substantially equal to the reset voltage of the pixels of the matrix;

C) for each column of pixels, and after resetting of the corresponding storage nodes: successively activating the row select transistors, sampling the voltage at the terminals of the storage node of the corresponding pixel, subtracting the reference voltage sampled in the step B) from the duly sampled voltage and digitizing the result, so as to acquire, row by row, a first digital image called black image;

and then:

D) activating the transfer transistors of all the pixels, so as to produce a global charge transfer from the photodiodes to the storage nodes of said pixels;

E) sampling a reference voltage, generated in said read circuit and of value substantially equal to the reset voltage of the pixels of the matrix;

F) for each column of pixels, and after charge transfer to the corresponding storage nodes: successively activating the row select transistors, sampling the voltage at the terminals of the storage node of the corresponding pixel, subtracting the reference voltage sampled in the step E) from the duly sampled voltage and digitizing the result, so as to acquire, row by row, a second digital image, called integration image.

11. The method of claim 10, wherein the steps D) to F) are repeated at least once, according to a signal level of said integration image or images, before once again performing the steps A) to C), such that one or more integration images are acquired for one and the same black image.

12. The method of claim 11, also comprising a step consisting in subtracting, from said or from one said integration image, the corresponding black image.

* * * * *